(12) United States Patent
Hirschler et al.

(10) Patent No.: US 8,815,706 B2
(45) Date of Patent: Aug. 26, 2014

(54) METHODS OF FORMING SEMICONDUCTOR DEVICES

(75) Inventors: Joachim Hirschler, Villach (AT); Michael Roesner, Villach (AT); Manfred Engelhardt, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 285 days.

(21) Appl. No.: 13/355,003

(22) Filed: Jan. 20, 2012

(65) Prior Publication Data

US 2013/0189830 A1 Jul. 25, 2013

(51) Int. Cl.
*H01L 21/00* (2006.01)
*H01L 21/56* (2006.01)
*H01L 21/683* (2006.01)

(52) U.S. Cl.
CPC ........... *H01L 21/568* (2013.01); *H01L 21/6836* (2013.01); *H01L 2221/68327* (2013.01)
USPC .................................. 438/464; 257/E21.599

(58) Field of Classification Search
CPC ............ H01L 21/31138; H01L 21/563; H01L 21/568; H01L 21/6836; H01L 2221/68327
USPC .................................... 438/464; 257/E21.599
See application file for complete search history.

(56) References Cited

U.S. PATENT DOCUMENTS

| | | | |
|---|---|---|---|
| 5,389,182 A | 2/1995 | Mignardi | |
| 6,258,728 B1 | 7/2001 | Donohoe et al. | |
| 6,277,759 B1 | 8/2001 | Blalock et al. | |
| 6,475,966 B1 | 11/2002 | Sahbari | |
| 6,642,127 B2 | 11/2003 | Kumar et al. | |
| 7,060,531 B2 | 6/2006 | Arita | |
| 7,994,026 B2 | 8/2011 | Harikai et al. | |
| 8,058,150 B2 | 11/2011 | Wu et al. | |
| 2002/0187422 A1 * | 12/2002 | Angelopoulos et al. | ... 430/270.1 |

(Continued)

FOREIGN PATENT DOCUMENTS

| | | | |
|---|---|---|---|
| EP | 2 015 356 A1 | 1/2009 | |
| EP | 2015356 A1 * | 1/2009 | .............. H01L 21/78 |
| WO | WO 01/56063 A2 | 8/2001 | |

OTHER PUBLICATIONS

Anderson, T.J., et al. 21$^{st}$ International Course Program on Semiconductor Technology, Nanotechnology, and Device Design, Jun. 7-11, 2004, 3 pages, Davos Convention Center, Switzerland.

(Continued)

*Primary Examiner* — William F Kraig
*Assistant Examiner* — Joseph C Nicely
(74) *Attorney, Agent, or Firm* — Slater & Matsil, L.L.P.

(57) ABSTRACT

In accordance with an embodiment of the present invention, a method of fabricating a semiconductor device includes forming a trench from a top surface of a substrate having a device region. The device region is adjacent to the top surface than an opposite bottom surface. The trench surrounds the sidewalls of the device region. The trench is filled with an adhesive. An adhesive layer is formed over the top surface of the substrate. A carrier is attached with the adhesive layer. The substrate is thinned from the bottom surface to expose at least a portion of the adhesive and a back surface of the device region. The adhesive layer is removed and adhesive is etched to expose a sidewall of the device region.

25 Claims, 8 Drawing Sheets

(56) References Cited

U.S. PATENT DOCUMENTS

| | | |
|---|---|---|
| 2004/0113283 A1 | 6/2004 | Farnworth et al. |
| 2005/0249932 A1* | 11/2005 | Wang et al. .................. 428/219 |
| 2009/0127692 A1* | 5/2009 | Kawate et al. ................ 257/692 |
| 2009/0277873 A1* | 11/2009 | Morikawa et al. ............. 216/63 |
| 2010/0009518 A1* | 1/2010 | Wu et al. ....................... 438/462 |
| 2010/0022071 A1 | 1/2010 | Arita et al. |
| 2010/0033670 A1* | 2/2010 | Fujita et al. .................. 349/158 |
| 2010/0165442 A1* | 7/2010 | Tung et al. .................... 359/290 |
| 2010/0233867 A1 | 9/2010 | Akiyama et al. |
| 2011/0136298 A1* | 6/2011 | Kikuchi et al. ............... 438/121 |
| 2012/0115252 A1* | 5/2012 | Miura .............................. 438/3 |
| 2012/0292117 A1* | 11/2012 | John et al. ..................... 175/428 |
| 2013/0192992 A1* | 8/2013 | Mardilovich et al. .......... 205/50 |

OTHER PUBLICATIONS

Mariani, F., et al., "Current Challenges in Preassembly, The Focus Changes from Thinning to Singulation," Infineon, KGD Packaging & Test Workshop, Sep. 9-12, 2007, 29 pages, Napa, California.

* cited by examiner

FIG. 12

METHODS OF FORMING SEMICONDUCTOR DEVICES

TECHNICAL FIELD

The present invention relates generally to semiconductor devices, and more particularly to method of forming semiconductor devices.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, the semiconductor devices on the wafer are separated. For example, the wafer may undergo singulation. During singulation, the wafer is mechanically treated and the semiconductor devices are physically separated to form individual dies. Purely mechanical separation is not very space efficient compared to chemical processes. However, chemical separation of small sized dies requires overcoming many difficult process issues.

SUMMARY OF THE INVENTION

These and other problems are generally solved or circumvented, and technical advantages are generally achieved, by illustrative embodiments of the present invention.

In accordance with an embodiment of the present invention, a method of fabricating a semiconductor device comprises forming a trench from a top surface of a substrate having a device region, which is adjacent to the top surface than an opposite bottom surface. The trench surrounds the sidewalls of the device region. The trench is filled with an adhesive. An adhesive layer is formed over the top surface of the substrate. A carrier is attached with the adhesive layer. The substrate is thinned from the bottom surface to expose at least a portion of the adhesive and a back surface of the device region. The adhesive layer is removed and adhesive is etched to expose a sidewall of the device region.

In accordance with another embodiment of the present invention, a method of fabricating a semiconductor device includes embedding a plurality of chips in an adhesive. The adhesive covers a top surface and sidewalls of each chip of the plurality of chips. A high density plasma is generated using $CF_4$ and oxygen. The adhesive is removed using the high density plasma thereby exposing the sidewalls and the top surface.

In accordance with another embodiment of the present invention, a method of fabricating a semiconductor device includes forming a trench from a top surface of a substrate having a device region. The device region is adjacent to the top surface than an opposite bottom surface of the substrate. The trench surrounds sidewalls of the device region. The trench is filled with an adhesive. An adhesive layer is formed by the adhesive over the top surface of the substrate. A carrier is attached with the adhesive layer. The substrate is thinned from the bottom surface to expose at least a portion of the adhesive and a back surface of the device region. A high density plasma is generated using $CF_4$ and oxygen. The adhesive in the trench and over the top surface of the substrate is etched using the high density plasma to expose a sidewall of the device region.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a semiconductor device during fabrication after formation of device regions and metallization layers in accordance with embodiments of the invention, wherein

FIG. 6, which includes FIGS. 6A and 6B, illustrates the semiconductor device, wherein a plurality of chips are embedded in a matrix of the adhesive component, wherein

FIG. 8, which includes FIGS. 8A and 8B, illustrates the semiconductor device after the removal of the adhesive component in accordance with embodiments of the invention, wherein

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Chip Scale Packages (CSP) are used for packing small components such as diodes, transistors, and others. CSPs typically have an area no greater than 1.2 times that of the die and are usually a single-die, direct surface mountable package. For example, die sizes may be vary between about 0.05 mm$^2$ to about 50 mm$^2$. Because of the small sized dies, each wafer yields many thousand units. For example, an 8-inch wafer can yield up to 200,000 to 600,000 dies. Assembly of such small sized dies may be performed after fabrication in a different or same facility by picking up loose dies, for example, using a special pick up process like "ball feed" method.

For small sized dies, substantial amount of real estate on the silicon wafer may be lost to dicing streets, which are regions that separate adjacent dies. Therefore, methods of forming small semiconductor dies are needed using narrow dicing streets. Narrow dicing streets may be enabled by the use of chemical and/or plasma etching processes. However, chemical etching processes cannot practically (within a reasonable time) etch through the complete wafer. Therefore, a combination of mechanical and chemical processes has to be used in dicing a wafer into a plurality of semiconductor dies. However, such methods require overcoming the problems associated with stabilizing a thin wafer during a thinning or grinding process. Embodiments of the invention overcome these and other problems to enable dicing of semiconductor wafer into dies.

FIGS. 1-8 illustrate a method of fabricating a semiconductor die in accordance with an embodiment of the invention. FIGS. 9-12 illustrate alternative embodiments of fabricating the semiconductor die.

Figure 1A:
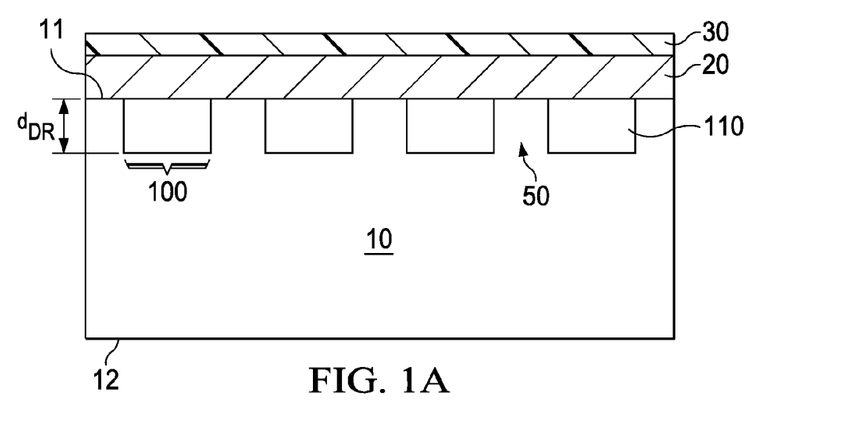
FIG. 1A illustrates a cross-sectional view and FIG. 1B illustrates a top view.
Figure 1B:
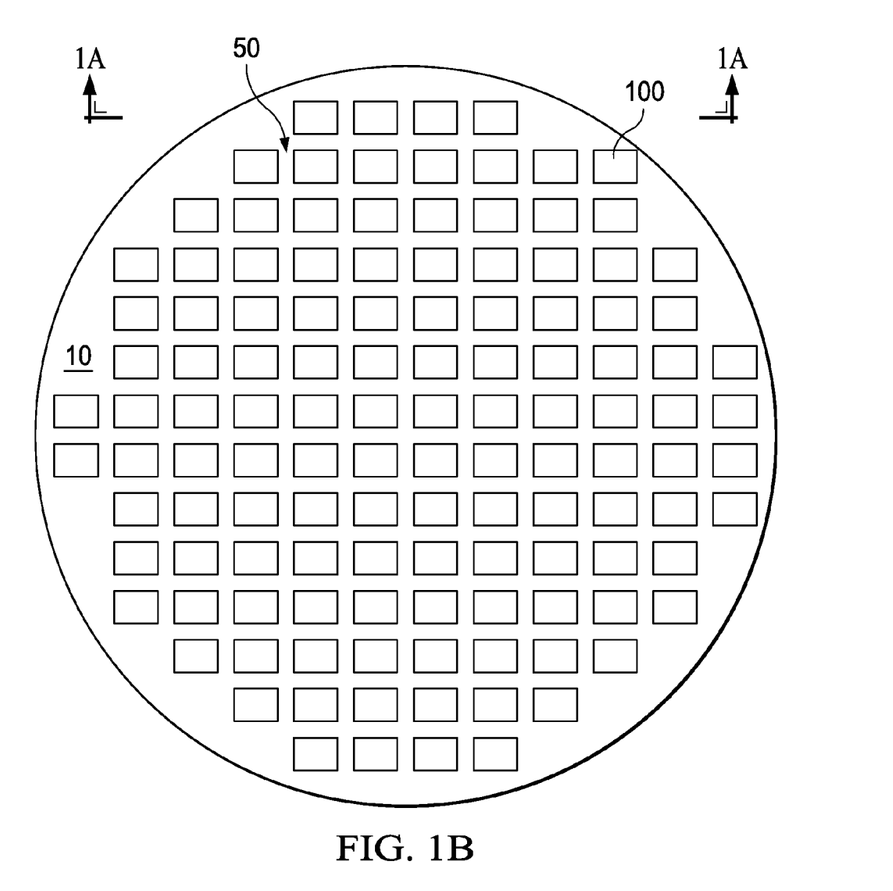

FIG. 1, which includes FIGS. 1A and 1B, illustrates a semiconductor substrate after formation of device regions and metallization layers, wherein FIG. 1A illustrates a cross-sectional view and FIG. 1B illustrates a top view.

Referring to FIG. 1A, a semiconductor substrate 10 after the completion of front end processing and back end processing is illustrated. The semiconductor substrate 10 has a plurality of semiconductor devices, i.e., chip 100, formed within. The chip 100 may be any type of chip. For example, the chip 100 may be a logic chip, a memory chip, an analog chip, and other types of chips. The chip 100 may comprise a plurality of devices such as transistors or diodes forming an integrated circuit or may be a discrete device such as a single transistor or a single diode.

In one embodiment, the substrate 10 may comprise a semiconductor wafer such as a silicon wafer. In other embodiments, the substrate 10 may comprise other semiconductor materials including alloys such as SiGe, SiC or compound semiconductor materials such as GaAs, InP, InAs, GaN, sapphire, silicon on insulation, for example.

Referring to FIG. 1A, device regions 110 are disposed within the substrate 10. The device regions 110 may include doped regions in various embodiments. Further, some portion of the device regions 110 may be formed over the substrate 10. The device regions 110 may include the active regions such as channel regions of transistors.

The substrate 10 comprises a top surface 11 and an opposite bottom surface 12. In various embodiments, the active devices are formed closer to the top surface 11 of the substrate 10 than the bottom surface 12. The active devices are formed in device regions 110 of the substrate 10. Device regions 110 extends over a depth $d_{DR}$, which depending on the device, is about 50 μm to about 500 μm, and about 200 μm in one embodiment.

In various embodiments, all necessary interconnects, connections, pads etc. for coupling between devices and/or with external circuitry are formed over the substrate 10. Accordingly, a metallization layer 20 is formed over the substrate 10. The metallization layer 20 may comprise one or more levels of metallization. Each level of metallization may comprise metal lines or vias embedded within an insulating layer. The metallization layer 20 may comprise metal lines and vias to contact the device regions 110 and also to couple different devices within each chip 100.

A protective layer 30, such as a passivation layer, may be formed over the metallization layer 20 before further processing. The protective layer 30 may comprise an oxide, nitride, polyimide, or other suitable materials known to one skilled in the art. The protective layer 30 may comprise a hard mask in one embodiment, and a resist mask in another embodiment. The protective layer 30 helps to protect the metallization layer 20 as well as the device regions 110 during subsequent processing.

Further, a final depth of the chip 100 will be determined after thinning as will be described subsequently. The bottom surface of the device regions 110 is therefore shown as dashed lines.

FIG. 1B illustrates a top view of the substrate 10 comprising a plurality of chips. Each chip 100 is separated from each other by a plurality of regions called scribe lines or dicing channels 50. The dicing channels 50 may comprise additional circuitry or other structures, which may be used for testing.

Figure 2:
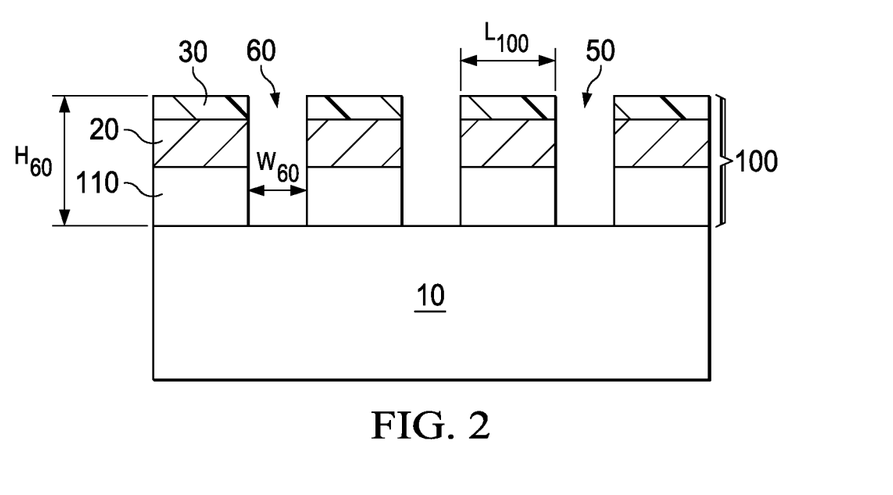
FIG. 2 illustrates the semiconductor device after the formation of a plurality of trenches in accordance with embodiments of the invention.

Referring to the cross-sectional view of FIG. 2, a plurality of trenches 60 is formed. In various embodiments, the plurality of trenches 60 is formed using a plasma dicing process. The plurality of trenches 60 are formed along the dicing channels 50. As illustrated in FIG. 2, after the partial dicing, the height $H_{60}$ of the plurality of trenches 60 is about 50 μm to about 500 μm, and about 200 μm in one embodiment. The width $W_{60}$ of the plurality of trenches 60 is about 10 μm to about 50 μm, and about 20 μm in one embodiment. The length $L_{100}$ of the chip 100 is about 200 μm to about 10 mm, and about 300 μm in one embodiment. The ratio of the height $H_{60}$ of the plurality of trenches 60 to the length $L_{100}$ of the chip 100 is about 2.5:1 (small chip area) to about 1:20 (large chip area).

Figure 3:
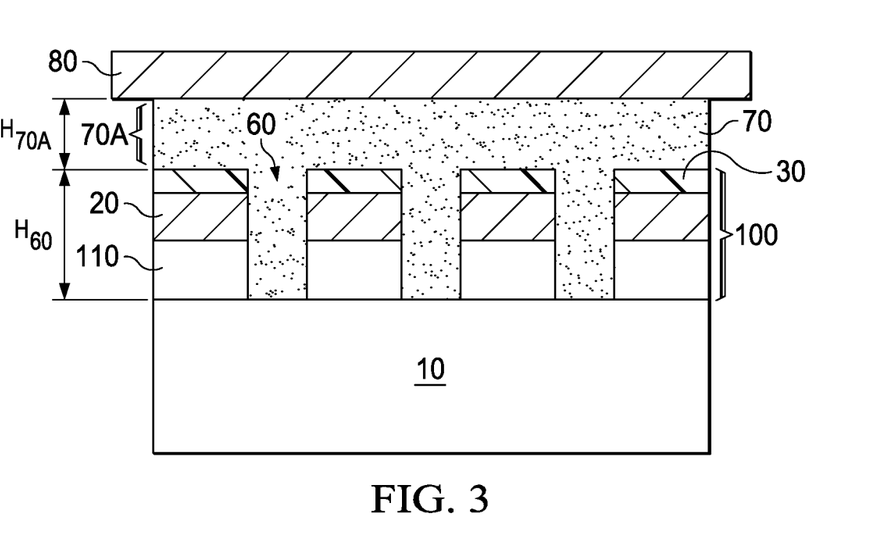
FIG. 3 illustrates the semiconductor device after filling the plurality of trenches with an adhesive component and attaching a carrier in accordance with embodiments of the invention.

Referring to FIG. 3, the substrate 10 is attached to a carrier 80 using an adhesive. The plurality of trenches 60 is filled with an adhesive compound 70. In various embodiments, the adhesive compound 70 surrounds all the sidewalls around the chip 100. In various embodiments, having an adhesive layer over only the top surface of the protective layer 30 as in conventional wafer handling process is not sufficient to provide mechanical stability because of the large number of small chips 100. Because of the small area of the chip 100 and the large number of chips 100 per wafer (e.g., about 200,000 to about 500,000), they are also supported along the sidewalls to avoid mechanical failure of the substrate 10 during substrate thinning.

After filling the plurality of trenches 60 with the adhesive compound 70, an overfill layer 70A is formed over the top surface of the protective layer 30. In various embodiments, the overfill layer 70A has a thickness of about 1 µm to about 100 µm.

A carrier 80 is placed over the overfill layer 70A of the adhesive compound 70. The viscous nature of the adhesive compound 70 allows it to flow along the sidewalls of the plurality of trenches 60. In various embodiments, the surface tension and viscosity of the adhesive compound 70 are selected to maximize wetting of the sidewalls of the plurality of trenches 60.

Further, in some embodiments, a primer coating may be applied prior to coating the adhesive compound 70. The primer coating is tuned to react with the surface of the plurality of trenches 60 and convert potentially high surface energy surfaces to lower surface energy surfaces by forming a primer layer. Thus, the adhesive compound 70 interacts only with the primer layer improving the bonding.

The adhesive compound 70 may comprise an organic compound such an epoxy based compound in one or more embodiments. In various embodiments, the adhesive compound 70 comprises an acrylic based, not photoactive, organic glue. In another embodiment, the adhesive compound 70 comprises SU-8, which is a negative tone epoxy based photo resist.

In alternative embodiments, the adhesive compound 70 may comprise a molding compound. In one embodiment, the adhesive compound 70 comprises an imide and/or components such a poly-methyl-methacrylate (PMMA) used in forming a poly-imide.

In another embodiment, the adhesive compound 70 comprises components for forming an epoxy-based resin or copolymer and may include components for a solid-phase epoxy resin and a liquid-phase epoxy resin. Embodiments of the invention also include combinations of different type of adhesive components and non-adhesive components such as combinations of acrylic base organic glue, SU-8, imide, epoxy-based resins etc.

In various embodiments, the adhesive component 70 comprises less than about 1% inorganic material, and about 0.1% to about 1% inorganic material in one embodiment. The absence of inorganic content improves the removal of the adhesive component 70 without leaving residues after plasma etching (described below in FIG. 7).

In one or more embodiments, the adhesive compound 70 may comprise thermosetting resins, which may be cured by annealing at an elevated temperature. Alternatively, in some embodiments, a low temperature anneal or bake may be performed to cure the adhesive compound 70 so that adhesive bonding between the carrier 80 and the adhesive compound 70 and between the adhesive compound 70 and the substrate 10 is formed. Some embodiments may not require any additional heating and may be cured at room temperature.

However, in various embodiments, the adhesive component 70 is chosen to minimize high temperature processes because, at this stage of processing, the device regions 110 and the metallization layer 20 has been already fabricated and therefore high temperature processing can have deleterious effect on these layers.

Figure 4:
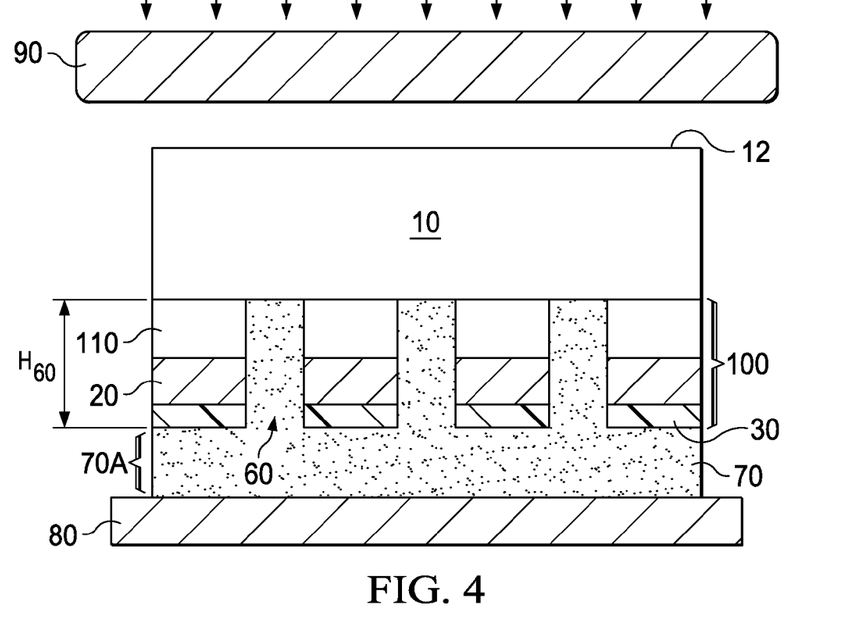
FIG. 4 illustrates a subsequent step before exposing the bottom surface of the substrate to a thinning process in accordance with embodiments of the invention.

As next illustrated in FIG. 4, the bottom surface 12 of the substrate 10 is exposed to a thinning process. A thinning tool 90, which may be a grinding tool in one embodiment, reduces the thickness of the substrate 10. In another embodiment, the thinning tool 90 may use a chemical process such as a wet etch or a plasma etch to thin the substrate 10.

Figure 5:
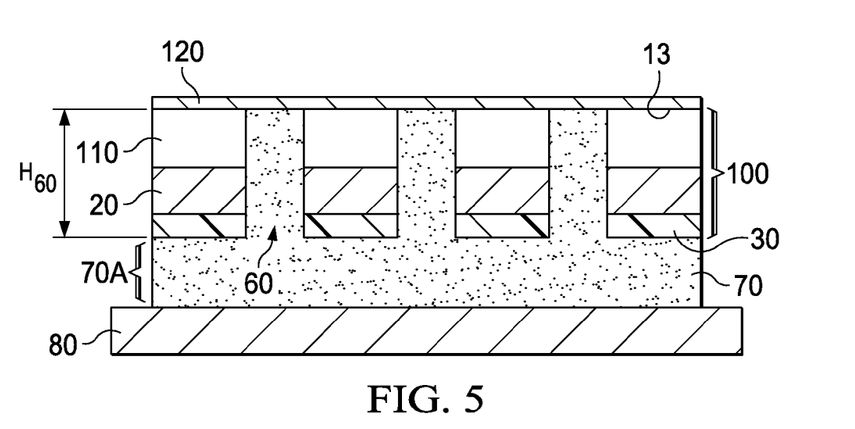
FIG. 5 illustrates the semiconductor device after a thinning process in accordance with embodiments of the invention.

Referring to FIG. 5, the thinning process is stopped after reaching the bottom surface of the plurality of trenches 60. Thus, after the thinning, an under surface 13 of the device regions 110 is exposed along with a surface of the adhesive component 70 within the plurality of trenches 60.

A back side metallization layer 120 is formed over the under surface 13. The back side metallization layer 120 may be formed as a blanket (unpatterned) metal layer in one embodiment. In another embodiment, a patterned metal layer may be formed within the back side metallization layer 120. In one embodiment, redistribution lines may be formed within the back side metallization layer 120. The redistribution lines may be used as interconnect on the back side, for example, coupling different circuit blocks (e.g., devices on a system on chip).

Figure 6A:
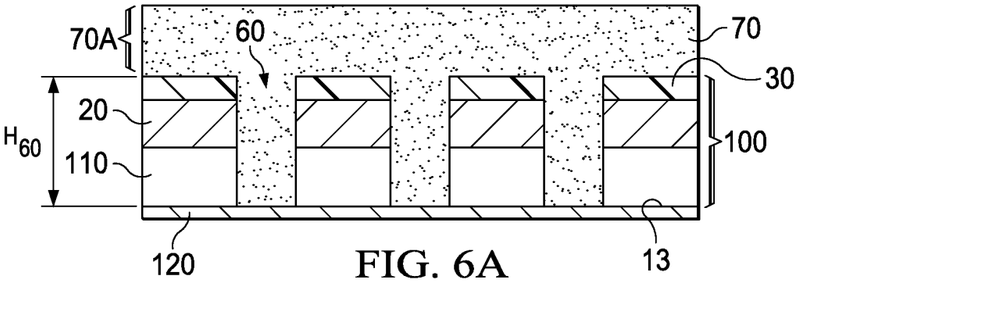
FIG. 6A illustrates a cross-sectional view and FIG. 6B illustrates a top view.
Figure 6B:
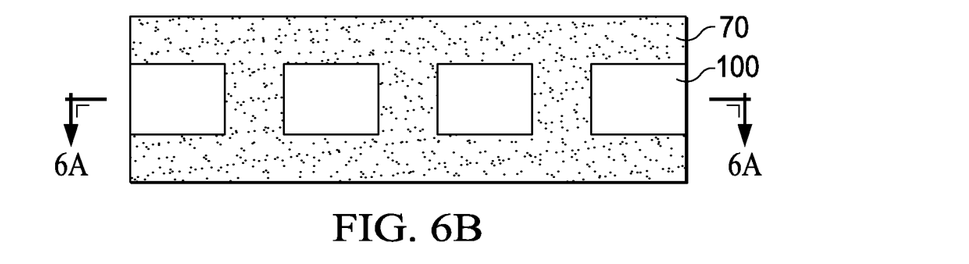

FIG. 6, which includes FIGS. 6A and 6B, illustrates the plurality of chips embedded in a matrix of the adhesive component 70, wherein FIG. 6A illustrates a cross-sectional view and FIG. 6B illustrates a top view. At this stage of processing, the chips 100 are suspended within the adhesive component 70 because the substrate 10 has been removed by thinning (FIG. 6B). The chips 100 may be attached along the under surface 13 by the back side metallization layer 120.

Figure 7:
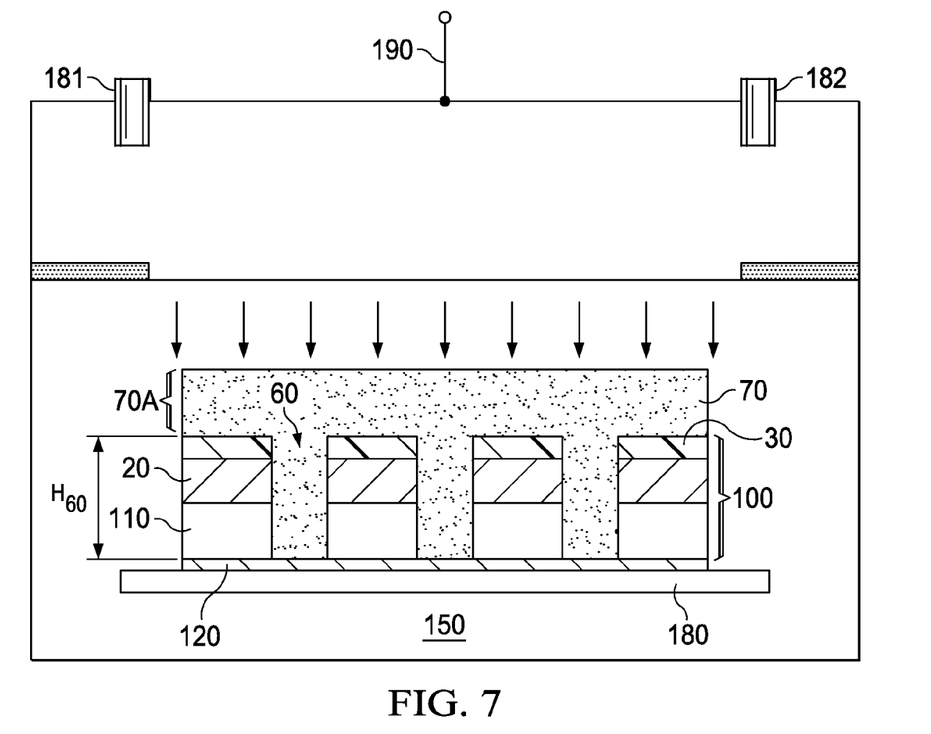
FIG. 7 illustrates the semiconductor device during a plasma etching process to remove the adhesive component in accordance with embodiments of the invention.

Referring to FIG. 7, the embedded chips 100 are placed within a plasma chamber 150 of a plasma tool and subjected to a plasma process.

In various embodiments, a high density plasma is used to remove the adhesive component 70. Accordingly, the plasma tool is a high density plasma etch tool, for example, an microwave generator plasma tool or alternatively an inductively coupled plasma tool. The plasma chemistry is controlled by a flow of gasses through the chamber from an inlet 181 and an outlet 182. The wafer like structure having the plurality of chips 100 embedded in the adhesive compound 70 is placed on a chuck. The plasma may be generated by powering the power input node 190 from about 100 W to about 2000 W, and about 850 W in one embodiment. Additionally remote plasma generated by a microwave plasma generation unit may be used in some embodiments.

In various embodiments, the plasma is formed from a mixture of tetra-fluoro-methane ($CF_4$) and oxygen. In an etch chemistry comprising $CF_4$, the addition of $O_2$ results in creation of more free fluorine radicals that increases the reactivity of the plasma.

Conventional plasma processes using low density process significantly etch silicon dioxide and silicon nitride. Further, this etching is isotropic exasperating any over etch of the overlying layers. Embodiments of the invention avoid such deleterious removal of oxide and nitride layers from over the chip 100 by using an etch chemistry having improved selectivity. In various embodiments, the relative amount of $CF_4$ in the plasma relative to oxygen is very low, which improves the selectivity of the plasma. In one or more embodiments, wherein a ratio of the amount of the $CF_4$ to the amount of the oxygen in the gas fed through the inlet 181 into the plasma chamber 150 is about 1:10 to about 1:100. In various embodiments, the etch selectivity between the adhesive component 70 and silicon dioxide is about 1:0.05 to about 1:0.1, between the adhesive component 70 and silicon nitride is about 1:0.05 to about 1:0.1, and between the adhesive component 70 and silicon is about 1:0.025 to about 1:0.05. Therefore, the etching process removes the adhesive component 70 without removing the other components of the chip 100.

Further, in various embodiments, the etching is isotropic owing to the large number of fluorine radicals and chamber pressure. Having an isotropic etch process avoids the formation of spacers of adhesive component 70 around the sidewalls of the device regions 110. After the plasma process, the sidewalls of the device regions 110 expose the semiconductor material leaving no particles/residues or spacers of the adhesive component 70, which may be oxidized subsequently to form a native oxide. Advantageously, because of the volatile nature of the adhesive component 70 no particles or residue remain.

In various embodiments, the plasma process advantageously removes the adhesive component 70, for example, having a thickness of about 10 µm to about 50 µm, in less than one hour.

Figure 8A:
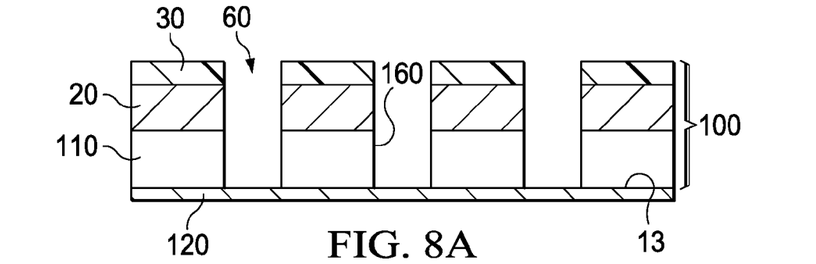
FIG. 8A illustrates a cross-sectional view and FIG. 8B illustrates a top view.
Figure 8B:
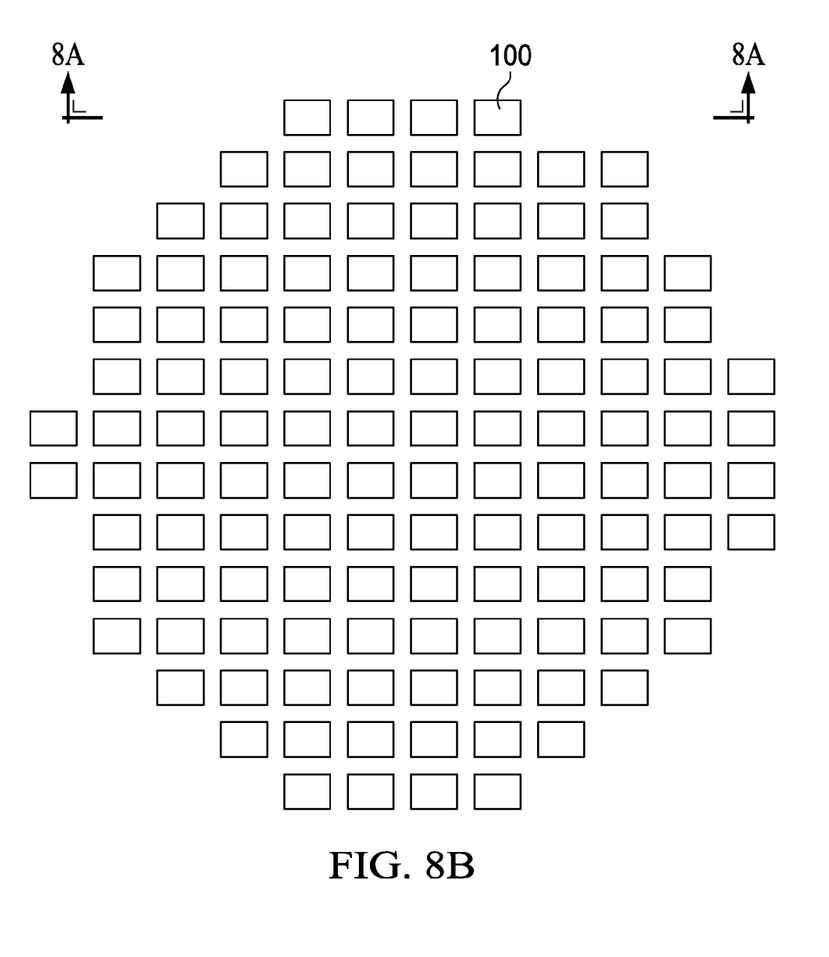

FIG. 8, which includes FIGS. 8A and 8B, illustrates the chips 100 after the removal of the adhesive component 70 in accordance with an embodiment of the invention, wherein FIG. 8A illustrates a cross-sectional view and FIG. 8B illustrates a top view. The back side metallization layer 120 may be diced or may be sufficiently thin to be broken by mechanical pressure (e.g., bending) thereby forming a plurality of semiconductor devices.

Figure 9:
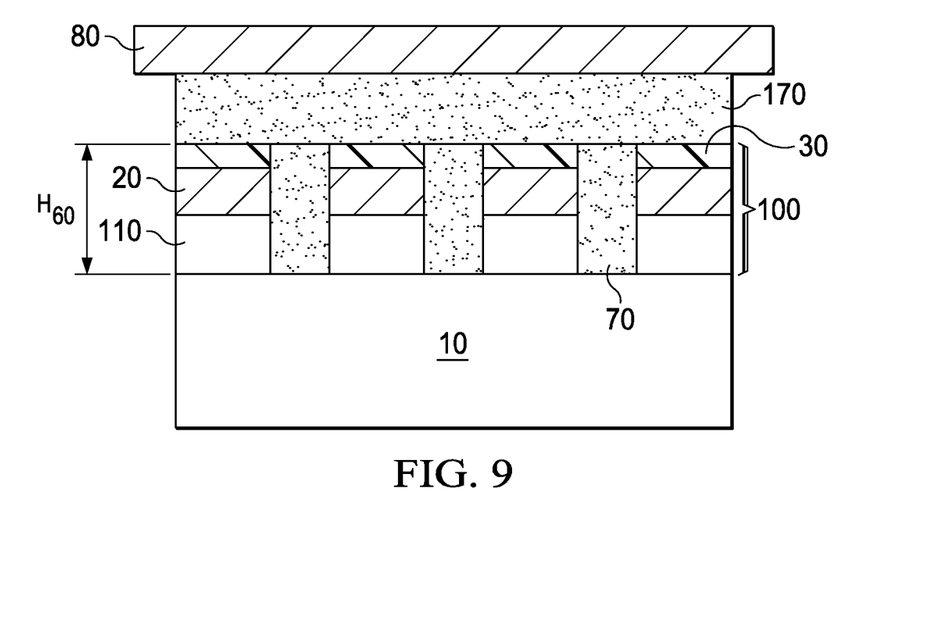
FIGS. 9-11 illustrate a cross-sectional view of a semiconductor device during various stages of fabrication in accordance with an alternative embodiment of the invention.
Figure 10:
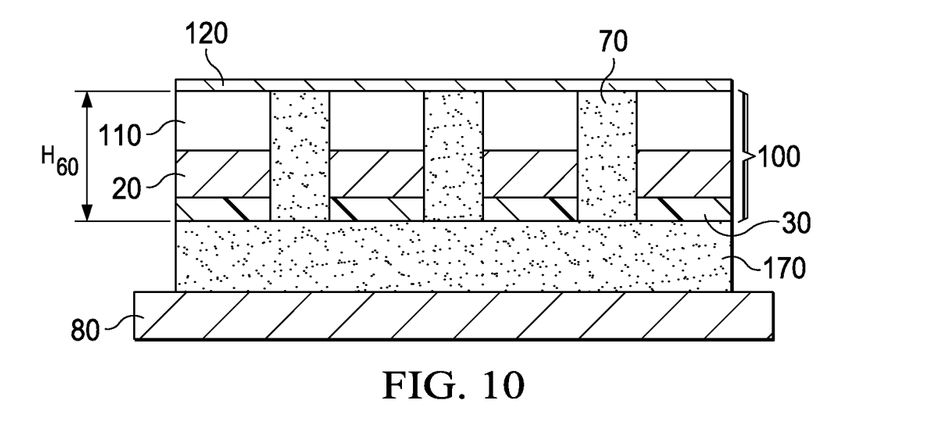
Figure 11:
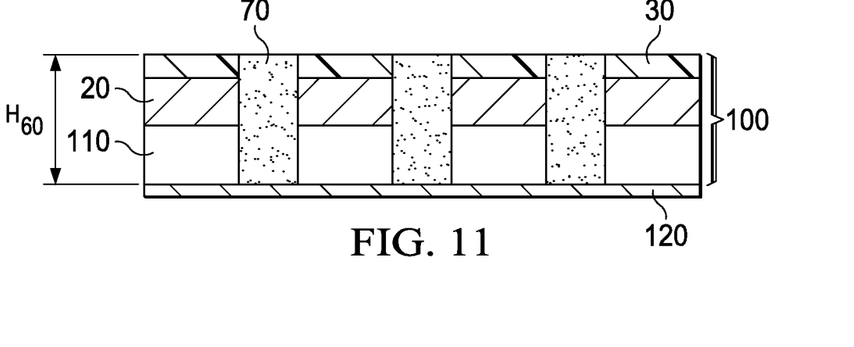

FIGS. 9-11 illustrate an alternate embodiment of the invention of forming a plurality of semiconductor devices.

In this embodiment, the process flow follows the prior embodiment as described with respect to FIGS. 1-2 in forming a plurality of trenches 60. However, subsequently, referring to FIG. 9, more than one adhesive is used in this embodiment. First, the plurality of trenches 60 is filled with an adhesive component 70. After filling the plurality of trenches 60, an adhesive layer having a second adhesive component 170 is formed over the top surface of the protection layer 30 and the top surface of the adhesive component 70. For example, the second adhesive component 170 may be chosen so that it is easily removed with a wet etch process thereby reducing the time for the plasma etch process. Alternatively, the second adhesive component 170 may be chosen to be removed faster in the plasma process. For example, the second adhesive component 170 may be less dense compared to the adhesive component 70 and may be etched faster. The second adhesive component 170 may have a different composition than the adhesive component 70 because of the different requirements between the material filling the trenches 60 and the planar adhesive layer. For example, the material filling the trenches 60 may be required to have good wettability so as to provide mechanical stability while the adhesive layer between the substrate 10 and the carrier 80 may only need to provide bonding support.

Referring to FIG. 10, a back side metallization layer 120 is formed as in the prior embodiment. Next, as illustrated in FIG. 11, the second adhesive component 170 is removed in a first etching step. In one embodiment, the first etching step is a wet etch process.

Next, the chips 100 are placed within an etch chamber and the adhesive component 70 is etched in a high density plasma as described with respect to FIG. 7. Subsequent processing follows the prior embodiment.

Figure 12:
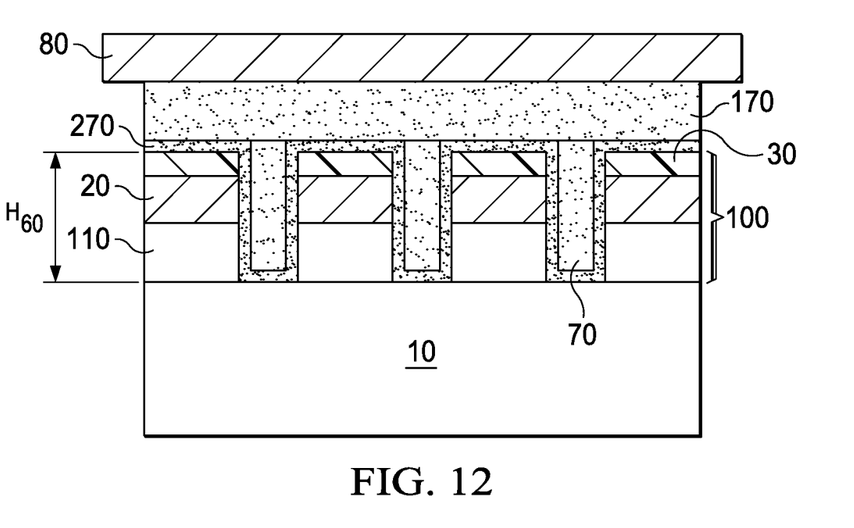
FIG. 12 illustrates a cross-sectional view of a semiconductor device during fabrication in accordance with another alternative embodiment of the invention.

FIG. 12 illustrates another embodiment of a method of fabricating a semiconductor device.

This embodiment is similar to the embodiment of FIG. 9-11 because it has the adhesive component 70 and the second adhesive component 170. However, this embodiment further includes a third adhesive component 270 between the adhesive component 70 and the sidewalls of the chip 100. In some embodiments, the second adhesive component 170 may be skipped thereby having only the adhesive component 70 and the third adhesive component 270.

As illustrated in FIG. 12, the third adhesive component 270 is formed as a liner over the sidewalls of the plurality of trenches 60, which form the sidewalls of the chip 100. The third adhesive component 270 may comprise a thickness of about 0.05 µm to about 0.1 µm in various embodiments. The third adhesive component 270 may be used to promote adhesion while improving the ease of removal of the adhesive subsequently.

For example, in one embodiment, the third adhesive component 270 may be much easier to remove in a etch process such as a plasma etch compared to the adhesive component 70. Therefore, the adhesive contacting the sidewalls of the chip 100 (third adhesive component 270) is removed without leaving any residues. In one or more alternative embodiments, the adhesive material may comprise a plurality of layers. Thus, in this embodiment, the density of the adhesive material reduces along the depth so that the deeper layers of the adhesive etch faster than the upper layers.

Further, in another example embodiment, the adhesive component 70 may be easier to remove than the third adhesive component 270. Such an embodiment may be used to lower the plasma etching time. This may be advantageous when the third adhesive component 270 provides the necessary structural stability that may not be possible to achieve using the adhesive component 70 directly on the sidewalls of the chip 100. Thus, in this embodiment, the density of the adhesive material increases along the depth so that the deeper layers of the adhesive take longer to etch while the upper layers are removed relatively faster.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1-8 may be combined with the embodiments described in FIG. 9-11 or FIG. 12. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
   forming a trench from a top surface of a substrate comprising a device region adjacent to the top surface, the trench surrounding sidewalls of the device region;
   filling the trench with an adhesive;
   forming an adhesive layer over the top surface of the substrate;

lining the sidewalls of the device region with a glue layer before filling the trench, the glue layer having a component different from the adhesive layer;

attaching a carrier with the adhesive layer;

thinning the substrate from a bottom surface to expose at least a portion of the adhesive and a back surface of the device region;

removing the adhesive layer; and etching the adhesive to expose a sidewall of the device region.

2. The method of claim 1, wherein the sidewall of the device region has no residue from the adhesive after the etching.

3. The method of claim 1, further comprising forming a back side metallization layer over the back surface of the device region before removing the adhesive layer and after thinning the substrate.

4. The method of claim 1, wherein an adhesive material of the adhesive is the same as an adhesive material of the adhesive layer.

5. The method of claim 4, wherein the adhesive and the adhesive layer are formed in a single continuous process.

6. The method of claim 1, wherein an adhesive material of the adhesive is different from an adhesive material of the adhesive layer.

7. The method of claim 1, wherein the adhesive material of the adhesive comprises an acrylic based organic glue.

8. The method of claim 1, wherein the adhesive material of the adhesive comprises an epoxy based negative photoresist.

9. The method of claim 1, wherein the adhesive material of the adhesive comprises less than about 1% inorganic material.

10. The method of claim 1, wherein the adhesive material of the adhesive comprises an imide.

11. The method of claim 1, wherein the trench is at least 1 μm deep, and wherein etching the adhesive comprises etching at least 1 μm of the adhesive using a high density plasma.

12. The method of claim 11, wherein the adhesive layer is at least 1 μm thick, and wherein removing the adhesive layer comprises using the high density plasma, the high density plasma formed using $CF_4$ and oxygen.

13. The method of claim 12, wherein a ratio of the amount of the $CF_4$ to the amount of the oxygen in forming the high density plasma is about 1:10 to about 1:100.

14. The method of claim 1, wherein a percentage of an adhesive component in the glue layer is higher than a percentage of an adhesive component in the adhesive.

15. The method of claim 1, further comprising:

forming a high density plasma using $CF_4$ and oxygen, wherein removing the adhesive layer comprises using the high density plasma, removing the adhesive thereby exposing the sidewalls and the top surface.

16. The method of claim 15, wherein a ratio of the amount of the $CF_4$ to the amount of the oxygen in forming the high density plasma is about 1:10 to about 1:100.

17. A method of fabricating a semiconductor device, the method comprising:

forming a trench from a top surface of a substrate comprising a device region adjacent to the top surface, the trench surrounding sidewalls of the device region;

lining the sidewalls of the device region with a glue layer;

after lining the sidewalls of the device region with the glue layer, filling the trench with an adhesive, the adhesive further forming an adhesive layer over the top surface of the substrate, the glue layer having a component different from the adhesive layer;

attaching a carrier with the adhesive layer;

thinning the substrate from a bottom surface to expose at least a portion of the adhesive and a back surface of the device region;

using $CF_4$ and oxygen, generating a high density plasma; and using the high density plasma, etching the adhesive in the trench and over the top surface of the substrate to expose a sidewall of the device region.

18. The method of claim 17, wherein a ratio of the amount of the $CF_4$ to the amount of the oxygen in generating the high density plasma is about 1:10 to about 1:100.

19. The method of claim 17, wherein the sidewall of the device region has no residue from the adhesive after the etching.

20. The method of claim 17, wherein a percentage of an adhesive component in the glue layer is higher than a percentage of an adhesive component in the adhesive.

21. A method of fabricating a semiconductor device, the method comprising:

forming a trench from a top surface of a substrate comprising a device region adjacent to the top surface, the trench surrounding sidewalls of the device region;

forming a first adhesive layer lining sidewalls of the device region;

forming a second adhesive layer within the trench and over the first adhesive layer, the first adhesive layer having a component different from the second adhesive layer;

forming a third adhesive layer over the top surface of the substrate;

attaching a carrier with the third adhesive layer;

thinning the substrate from a bottom surface to expose a back surface of the device region; and removing the first, the second, and the third adhesive layers.

22. The method of claim 21, wherein removing the first, the second, and the third adhesive layers comprises etching using a high density plasma.

23. The method of claim 22, further comprising forming the high density plasma using $CF_4$ and oxygen.

24. The method of claim 23, wherein a ratio of the amount of the $CF_4$ to the amount of the oxygen in forming the high density plasma is about 1:10 to about 1:100.

25. The method of claim 21, wherein a percentage of an adhesive component in the first adhesive layer is higher than a percentage of an adhesive component in the second adhesive layer.

* * * * *